(12) United States Patent
Nakao

(10) Patent No.: US 7,956,690 B2
(45) Date of Patent: Jun. 7, 2011

(54) OPERATIONAL AMPLIFICATION CIRCUIT
(75) Inventor: Kimihiro Nakao, Miyagi-Ken (JP)
(73) Assignee: ALPS Electric Co., Ltd., Tokyo (JP)
( * ) Notice: Subject to any disclaimer, the term of this patent is extended or adjusted under 35 U.S.C. 154(b) by 0 days.
(21) Appl. No.: 12/789,036
(22) Filed: May 27, 2010
(65) Prior Publication Data
US 2010/0301938 A1 Dec. 2, 2010
(30) Foreign Application Priority Data
May 28, 2009 (JP) ................. 2009-128848
(51) Int. Cl.
*H03F 3/45* (2006.01)
(52) U.S. Cl. ........................... 330/255; 330/257
(58) Field of Classification Search .............. 330/253, 330/255, 257
See application file for complete search history.

(56) References Cited

U.S. PATENT DOCUMENTS 7,557,658 B2 * 7/2009 Perez ............................ 330/255
7,786,801 B2 * 8/2010 Kim ............................... 330/255

FOREIGN PATENT DOCUMENTS

JP 05-063455 3/1993
JP 11-127037 5/1999

* cited by examiner

Primary Examiner — Khanh V Nguyen
(74) Attorney, Agent, or Firm — Brinks Hofer Gilson & Lione

(57) ABSTRACT

An operational amplification circuit includes a differential amplification circuit portion that amplifies a differential input, and an output circuit portion that outputs the amplified output using a signal amplified in the differential amplification circuit portion. The differential amplification circuit portion is provided with a pair of first transistors to which signals are differentially input, and second and third transistors which are connected to current paths of the pair of first transistors and which constitute current mirror circuits with respect to each other. The output circuit portion is provided with a fourth transistor, a gate of which is connected to a drain of the second transistor, and an amplified output is output from a drain of the fourth transistor.

4 Claims, 4 Drawing Sheets

OPERATIONAL AMPLIFICATION CIRCUIT

CROSS REFERENCE TO RELATED APPLICATIONS

The present invention contains subject matter related to and claims priority to Japanese Patent Application JP 2009-128848 filed in the Japanese Patent Office on May 28, 2009, the entire contents of which are incorporated herein by reference.

BACKGROUND

1. Technical Field

The present disclosure relates to an operational amplification circuit having a differential amplification circuit portion which uses a current mirror circuit.

2. Related Art

FIG. 4 is a diagram illustrating an example of an operational amplification circuit having a current mirror circuit in the related art. The operational amplification circuit is provided with a differential amplification circuit portion 1 in which a pair of MOS transistors T20 and T21 are differentially connected, a current mirror circuit portion 2, a constant current circuit portion 3, and an output circuit portion 4. The output circuit portion 4 is formed of a MOS transistor T22 and a load resistor 5 connected to a drain output terminal of the MOS transistor T22. A gate of the MOS transistor T22 is connected to a drain output terminal of the MOS transistor T20.

In the operational amplification circuit configured as described above, a differential amplification output of the drain of the MOS transistor T20 of the differential amplification circuit portion 1 is applied to the gate of the MOS transistor T22 of the output circuit portion 4, and an electric current corresponding to a gate voltage of the MOS transistor T22 flows in between the source and the drain of the MOS transistor T22, thereby outputting an output voltage $V_{OUT}$.

Examples of the related art are disclosed, for example, in Japanese Unexamined Patent Application Publication No. 5-63455 and Japanese Unexamined Patent Application Publication No. 11-127037.

SUMMARY

According to an aspect of the disclosure, there is provided an operational amplification circuit including a differential amplification circuit portion that amplifies a differential input and an output circuit portion that outputs the amplified output using a signal amplified in the differential amplification circuit portion. The differential amplification circuit portion is provided with a pair of first transistors to which signals are differentially input, and second and third transistors which are connected to current paths of the pair of first transistors and which constitute current mirror circuits with respect to each other. The output circuit portion is provided with a fourth transistor, a gate of which is connected to a drain of the second transistor, and an amplified output is output from a drain of the fourth transistor. A fifth transistor, a gate of which is connected to the drain of the second transistor, is provided between the second transistor and the ground, and a sixth transistor, a gate of which is connected to the drain of the third transistor, is provided between the third transistor and the ground.

DESCRIPTION OF EXEMPLARY EMBODIMENTS

Hereinafter, an embodiment of the invention will be described in detail with reference to the accompanying drawings.

Figure 1:
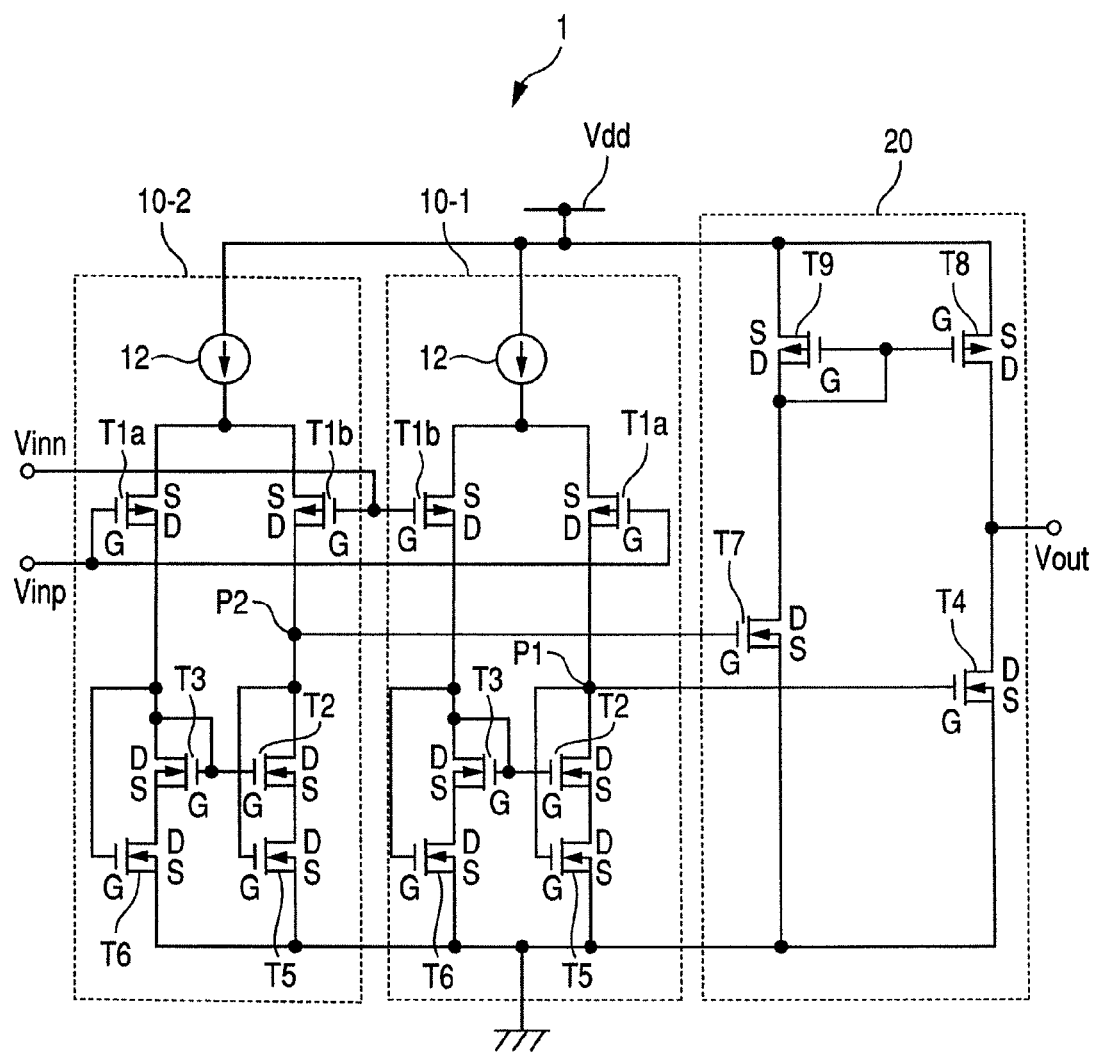
FIG. 1 is a circuit diagram illustrating an operational amplification circuit according to an embodiment of the disclosure.

FIG. 1 is a diagram illustrating a configuration of an operational amplification circuit according to an embodiment of the invention. The operational amplification circuit 1 is provided with first and second differential amplification circuit portions 10-1 and 10-2, and an output circuit portion 20 formed of a current mirror type push-pull circuit. The first and second differential amplification circuits 10-1 and 10-2 have the same configuration, and thus the same reference numerals and signs are given to the corresponding elements.

The first differential amplification circuit portion 10-1 is provided with a pair of PMOS transistors T1a and T1b to which signals (Vinn and Vinp) are differentially input. Sources of the PMOS transistors T1a and T1b are connected to a constant current source 12, a drain of the PMOS transistor T1a is connected to a drain of a second NMOS transistor T2 constituting a current mirror circuit, and a drain of the PMOS transistor T1b is connected to a drain of a third NMOS transistor T3 constituting the same mirror circuit. A positive input signal Vinp is input to a gate of the PMOS transistor T1a, and a negative input signal Vinn is input to a gate of the PMOS transistor T1b.

Sources of the second and third NMOS transistors T2 and T3 constituting the mirror circuits are connected to the ground through drains and sources of fifth and sixth NMOS transistors T5 and T6. A gate of the fifth NMOS transistor T5 is connected to the drain of the second NMOS transistor T2, and a gate of the sixth NMOS transistor T6 is connected to the drain of the third NMOS transistor T3.

The output circuit portion 20 is formed of a current mirror type push-pull circuit. Sources of eighth and ninth PMOS transistors T8 and T9 constituting current mirror circuits are connected to a power supply terminal Vdd, a drain of the eighth PMOS transistor T8 is connected to the ground through the drain and source of the fourth NMOS transistor T4, and a drain of the ninth PMOS transistor T9 is connected to the ground through the drain and source of the seventh NMOS transistor T7. The gate of the fourth NMOS transistor T4 is connected to the drain of the PMOS transistor T1a in the first differential amplification circuit portion 10-1, and the differential output voltage of the first differential amplification circuit portion 10-1 is applied to the gate of the fourth NMOS transistor T4. The gate of the seventh NMOS transistor T7 is connected to the drain of the PMOS transistor T1b in the second differential amplification circuit portion 10-2, and the differential output voltage of the second differential amplification circuit 10-2 is applied to the gate of the seventh NMOS transistor T7.

Next, the operation of the embodiment configured as described above will be described.

The differential input signals Vinp and Vinn are input to the first and second differential amplification circuit portions 10-1 and 10-2. In the first and second differential amplification circuit portions 10-1 and 10-2, a bias current flows which corresponds to the gate voltage of the differential input signal Vinp applied to the gate of the PMOS transistor T1*a*, and a bias current flows which corresponds to the gate voltage of the differential input signal Vinn applied to the gate of the PMOS transistor T1*b*. At this time, the same electric current flows in the second and third NMOS transistor T2 and T3 constituting the current mirror circuit, and the gate voltage corresponding to the differential current between the bias current flowing in the PMOS transistor T1*a* and the bias current flowing in the PMOS transistor T1*b* is applied to the fourth and seventh NMOS transistors T4 and T7 of the output circuit portion 20. The electric current corresponding to the gate voltage flows between the source and the drain of the fourth NMOS transistor T4, and the electric current corresponding to the gate voltage flows between the source and the drain of the seventh NMOS transistor T7. The same electric current flows in the eighth and ninth NMOS transistors T8 and T9 constituting the current mirror circuit, and the output voltage Vout corresponding to the differential current between the electric current flowing in the fourth NMOS transistor T4 and the electric current flowing in the seventh NMOS transistor T7 is taken out of the drain of the fourth NMOS transistor T4.

In the embodiment, as for the second NMOS transistor T2, the fifth NMOS transistor T5 is connected in series, and the gate of the fifth NMOS transistor T5 is connected to the drain (the gate of the fourth NMOS transistor T4) of the second NMOS transistor T2. For this reason, when the gate voltage with respect to the fourth NMOS transistor T4 tends to vary in a direction to increase, the gate voltage of the fifth NMOS transistor T5 also varies in the same direction. When the gate voltage of the fifth NMOS transistor T5 increases, the electric current flowing in the fifth NMOS transistor T5 increases, and the gate potential of the fourth and fifth NMOS transistors T4 and T5 decrease. Accordingly, the gate voltage of the fourth NMOS transistor T4 converges to a predetermined voltage. When the gate voltage of the fourth NMOS transistor T4 tends to vary in the direction to decrease, the gate voltage of the fifth NMOS transistor T5 varies to the same voltage in the same direction. Accordingly, the gate voltage of the fourth NMOS transistor T4 converges to a predetermined voltage.

In addition, as for the third NMOS transistor T3 constituting the current mirror circuit with the second NMOS transistor T2, the sixth NMOS transistor T6 is connected in series, and the gate of the sixth NMOS transistor T6 is connected to the drain of the third NMOS transistor T3. For this reason, the gate voltage of the fourth NMOS transistor T4 converges to the gate voltages of the second and third NMOS transistors T2 and T3.

As described above, even when the gate voltage of the fourth NMOS transistor T4 varies due to differences in production, the gate voltage of the fourth NMOS transistor T4 converges to a predetermined voltage by the feedback operation of the sixth NMOS transistor T6. Accordingly, it is possible to suppress the variation of the electric current flowing in the fourth NMOS transistor T4, and it is possible to realize a stable amplification operation.

The output circuit portion 20 is provided with the seventh NMOS transistor T7, and the output voltage of the second differential amplification circuit portion 10-2 is applied to the gate of the seventh NMOS transistor T7. Accordingly, when the gate voltage of the fourth NMOS transistor T4 cannot obtain a low output, the electric current flows between the source and the drain of the seventh NMOS transistor T7. Therefore, the output can be taken out of the source of the eighth NMOS transistor T8.

Next, a verification test result of the current variation situation in the embodiment and the comparative example will be described.

In the comparative example, the fifth and sixth NMOS transistors T5 and T6 are removed from the operational amplification circuit shown in FIG. 1.

Figure 2A:
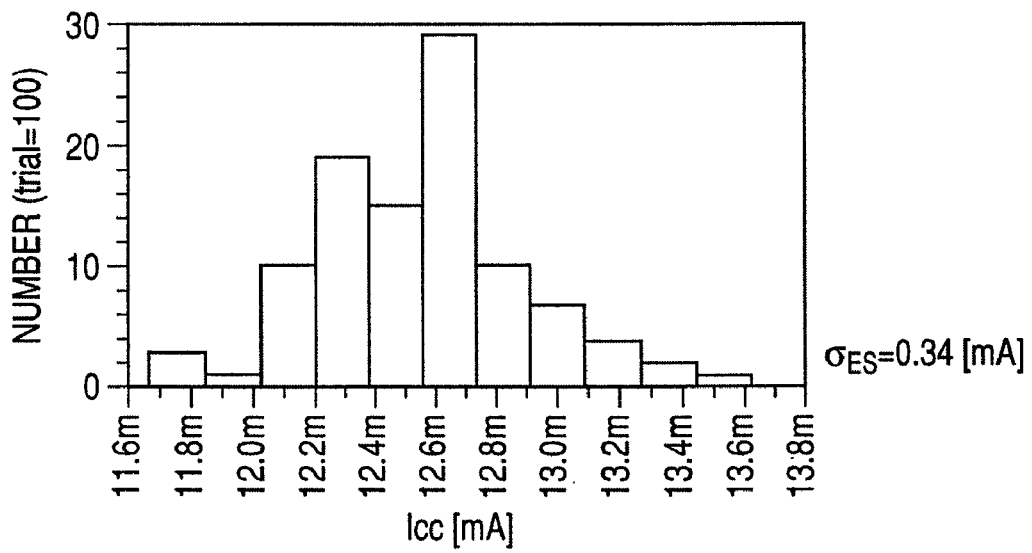
FIG. 2 is a graph illustrating a test result of current variation between lots of operational amplification circuits of the invention and operational amplification circuits in the related art.
Figure 2B:
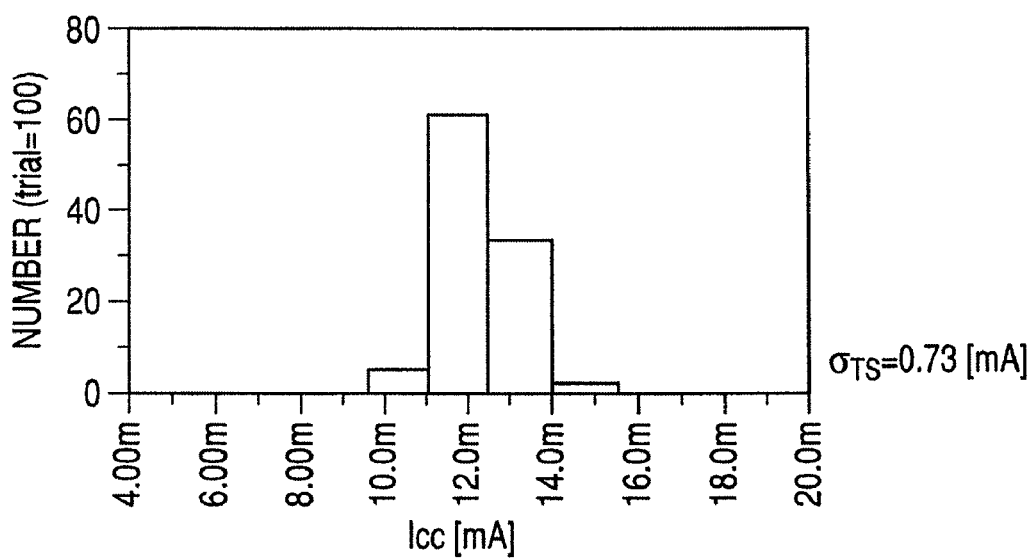

FIG. 2A and FIG. 2B are graphs illustrating the current variation when the NMOS transistors produced from different lots are used as the fourth and seventh NMOS transistors of the output circuit portion 20. FIG. 2A is a test result of the embodiment, and FIG. 2B is a test result of the comparative example. In the graphs, the vertical axis denotes a number (the number of samples) and the horizontal axis denotes an electric current (mA). The number of variation trial times used in the verification test is 100. As a result of the verification test, the operational amplification circuit was σES=0.34 [mA], but the comparative example was σTS=0.73 [mA]. In the current variation between lots, it was confirmed that the value of the comparative example is unsatisfactory. In addition, σTS(σES) is the standard deviation which can be obtained by the following formula.

Standard Deviation: $\sigma^2 = \Sigma(Ii - Iave)2/n$ (Iave: average value of electric current, Ii: sample value, n: number of trial times)

Figure 3A:
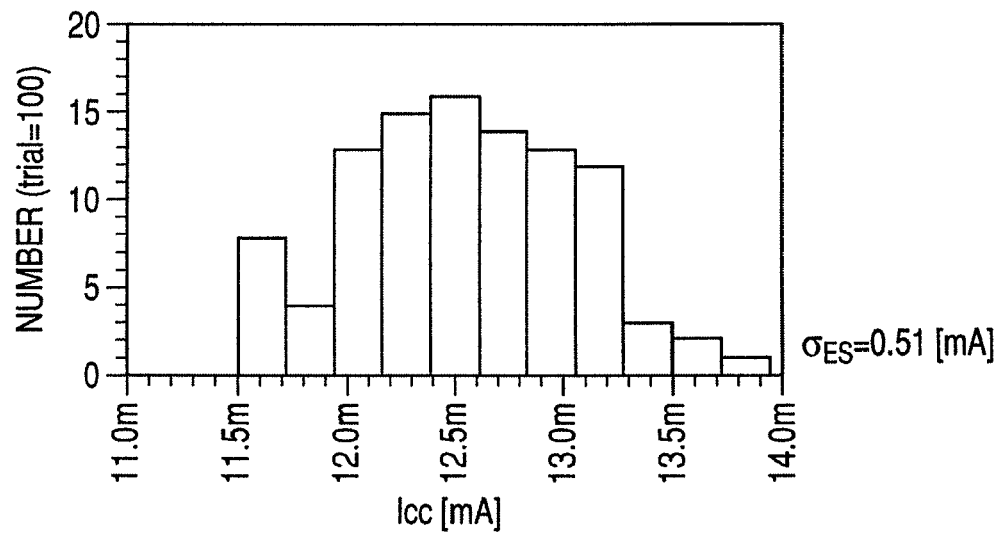
FIG. 3 is a graph illustrating a test result of current variation between wafers of the operation amplification circuits of the invention and the operational amplification circuits in the related art.
Figure 3B:
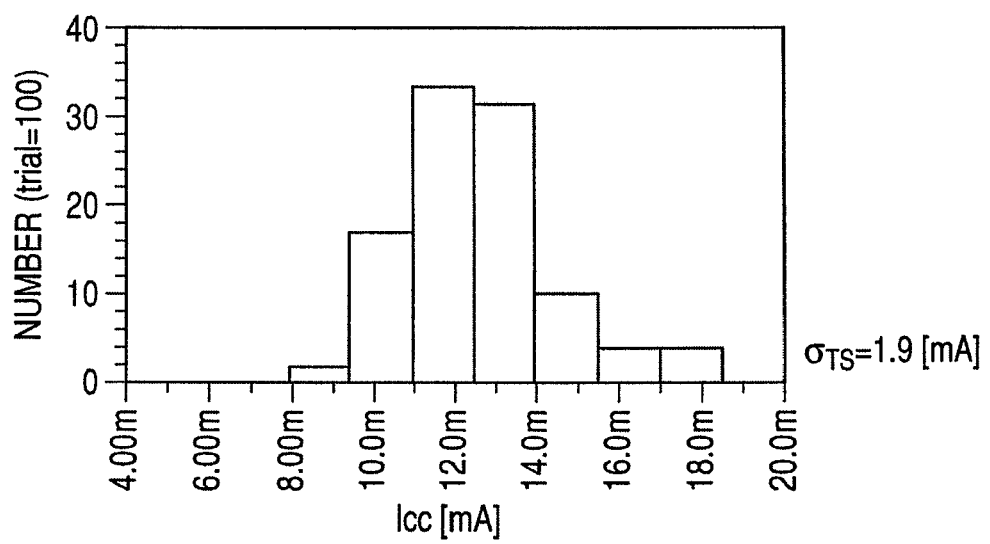
Figure 4:
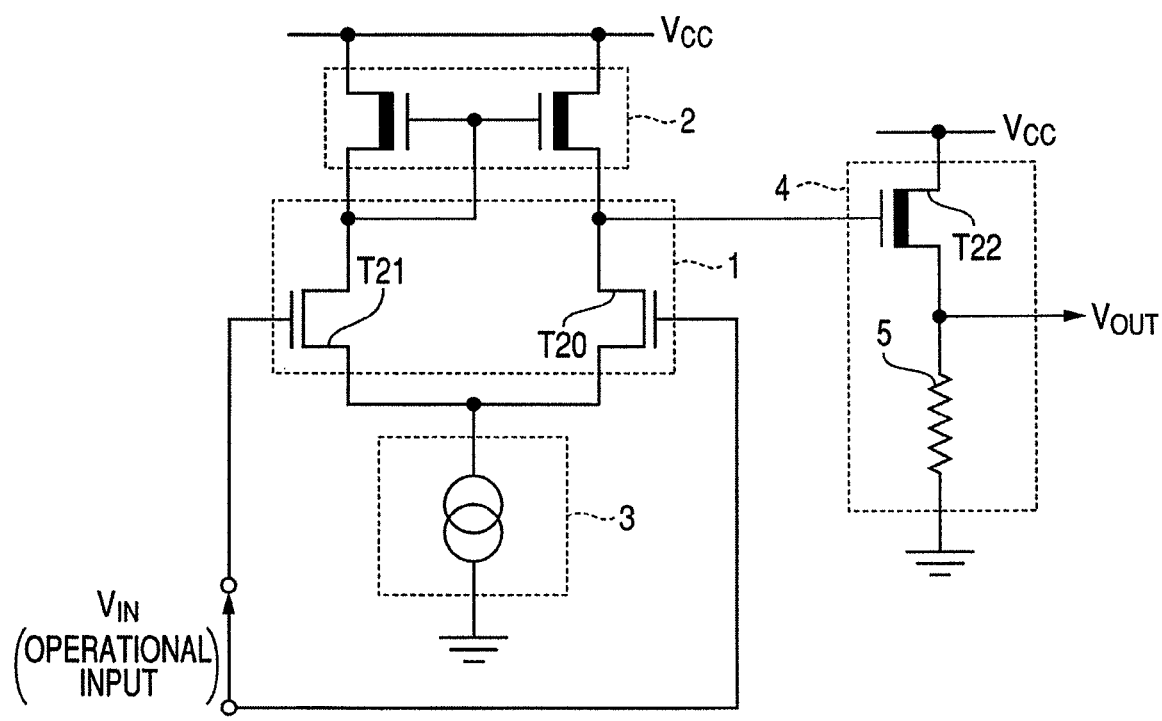
FIG. 4 is a circuit diagram illustrating the operational amplification in the related art.

FIG. 3A and FIG. 3B are graphs illustrating the current variation when the NMOS transistors produced from the same wafer are used as the fourth and seventh transistors of the output circuit. FIG. 3A is a test result of the operational amplification circuit of the embodiment, and FIG. 3B is a test result of the comparative example. In the graphs, the vertical axis denotes a number, and the horizontal axis denotes an electric current (mA). The number of variation trial times used in the verification test is 100. As a result of the verification test, the operational amplification circuit of the embodiment is σES=0.51 [mA], but the comparative example was σTS=1.9 [mA]. In the current variation in the wafer, it was confirmed that the value of the comparative example is unsatisfactory.

From the test result, clearly, in the operational amplification circuit of the invention, the current variation is reduced.

In the above description, the PMOS transistors are used as the transistors constituting the differential amplification circuit portions 10-1 and 10-2 of the first and second differential amplification circuit portion and the output circuit portion 20 of the operational amplification circuit, but NMOS transistors may be used instead of the PMOS transistors. When the NMOS transistors are used, the connection position of the constant current source 12 varies, but the basic configuration does not vary.

It should be understood by those skilled in the art that various modifications, combinations, sub-combinations and alterations may occur depending on design requirements and other factors insofar as they are within the scope of the appended claims of the equivalents thereof.

What is claimed is:

1. An operational amplification circuit comprising:
 a differential amplification circuit portion that amplifies a differential input; and
 an output circuit portion that outputs the amplified output using a signal amplified in the differential amplification circuit portion,
 wherein the differential amplification circuit portion comprises a pair of first transistors to which signals are differentially input, and second and third transistors which are connected to current paths of the pair of first transistors and which constitute a current mirror circuit with respect to each other, wherein the output circuit portion comprises a fourth transistor, a gate of which is connected to a drain of the second transistor, and an amplified output is output from a drain of the fourth transistor, and wherein a fifth transistor, a gate of which is connected to the drain of the second transistor, is provided between the second transistor and the ground, and a sixth transistor, a gate of which is connected to the drain of the third transistor, is provided between the third transistor and the ground.

2. The operational amplification circuit according to claim 1, wherein the sources of the pair of first transistors are connected to each other and the common connection point is connected to a power supply terminal through a constant current circuit.

3. The operational amplification circuit according to claim 1, further comprising other differential amplification circuit portion having the same configuration as the differential amplification circuit portion, wherein the output circuit portion comprises a seventh transistor, a gate of which is connected to the drain of the second transistor of the other differential amplification circuit portion, an eighth transistor connected between the fourth transistor and a power supply terminal, and a ninth transistor connected between the seventh transistor and the power supply terminal, and the eighth transistor and the ninth transistor constitute a current mirror circuits with respect to each other.

4. The operational amplification circuit according to any one of claim 1, wherein the fifth and sixth transistors have the same channel type as the second and third transistors.

* * * * *

UNITED STATES PATENT AND TRADEMARK OFFICE
CERTIFICATE OF CORRECTION

| | | |
|---|---|---|
| PATENT NO. | : 7,956,690 B2 | Page 1 of 1 |
| APPLICATION NO. | : 12/789036 | |
| DATED | : June 7, 2011 | |
| INVENTOR(S) | : Kimihiro Nakao | |

It is certified that error appears in the above-identified patent and that said Letters Patent is hereby corrected as shown below:

In the Claims

Column 6, claim 3, line 13, before "with respect to each" replace "circuits" with --circuit--.

Signed and Sealed this
Twenty-seventh Day of September, 2011

David J. Kappos
*Director of the United States Patent and Trademark Office*